United States Patent [19]

Bly et al.

[11] Patent Number: 4,849,070
[45] Date of Patent: Jul. 18, 1989

[54] PROCESS FOR FABRICATING THREE-DIMENSIONAL, FREE-STANDING MICROSTRUCTURES

[75] Inventors: Vincent T. Bly, Springfield; Alan P. Bradford, Alexandria; J. Thomas Cox, Fairfax Station, all of Va.

[73] Assignee: The United States of America as represented by the Secretary of the Army, Washington, D.C.

[21] Appl. No.: 243,750

[22] Filed: Sep. 14, 1988

[51] Int. Cl.$^4$ .................. B44C 1/22; C03C 15/00; C03C 25/06
[52] U.S. Cl. .................... 156/643; 156/644; 156/648; 156/651; 156/655
[58] Field of Search ............... 156/643, 644, 648, 651, 156/655, 659.1, 662, 902; 427/54.1; 437/228

[56] References Cited

U.S. PATENT DOCUMENTS

| | | | |
|---|---|---|---|
| 3,539,705 | 11/1970 | Nathanson et al. | 156/656 X |
| 3,846,166 | 11/1974 | Saiki et al. | 156/656 X |
| 4,262,399 | 4/1981 | Cady | 156/653 X |
| 4,674,180 | 6/1987 | Zavracky et al. | 156/656 X |
| 4,740,410 | 4/1988 | Muller et al. | 156/656 X |
| 4,783,237 | 11/1988 | Aine et al. | 156/655 X |

Primary Examiner—William A. Powell
Attorney, Agent, or Firm—Milton W. Lee; Aubrey J. Dunn; Anthony T. Lane

[57] ABSTRACT

A sublimable layer is deposited on a substrate, holes are etched through the sublimable layer, a thin-layer structure is deposited on portions of the remaining sublimable layer, and a thick structural support material is deposited to cover the sides and bottoms of the holes and portions of the thin-layer structure. When the sublimable layer is sublimed with the heat, photon enhancement (ultraviolet light) and oxygen purging, a structure is left which consists of a thin layer or layers supported by posts above a substrate.

1 Claim, 1 Drawing Sheet

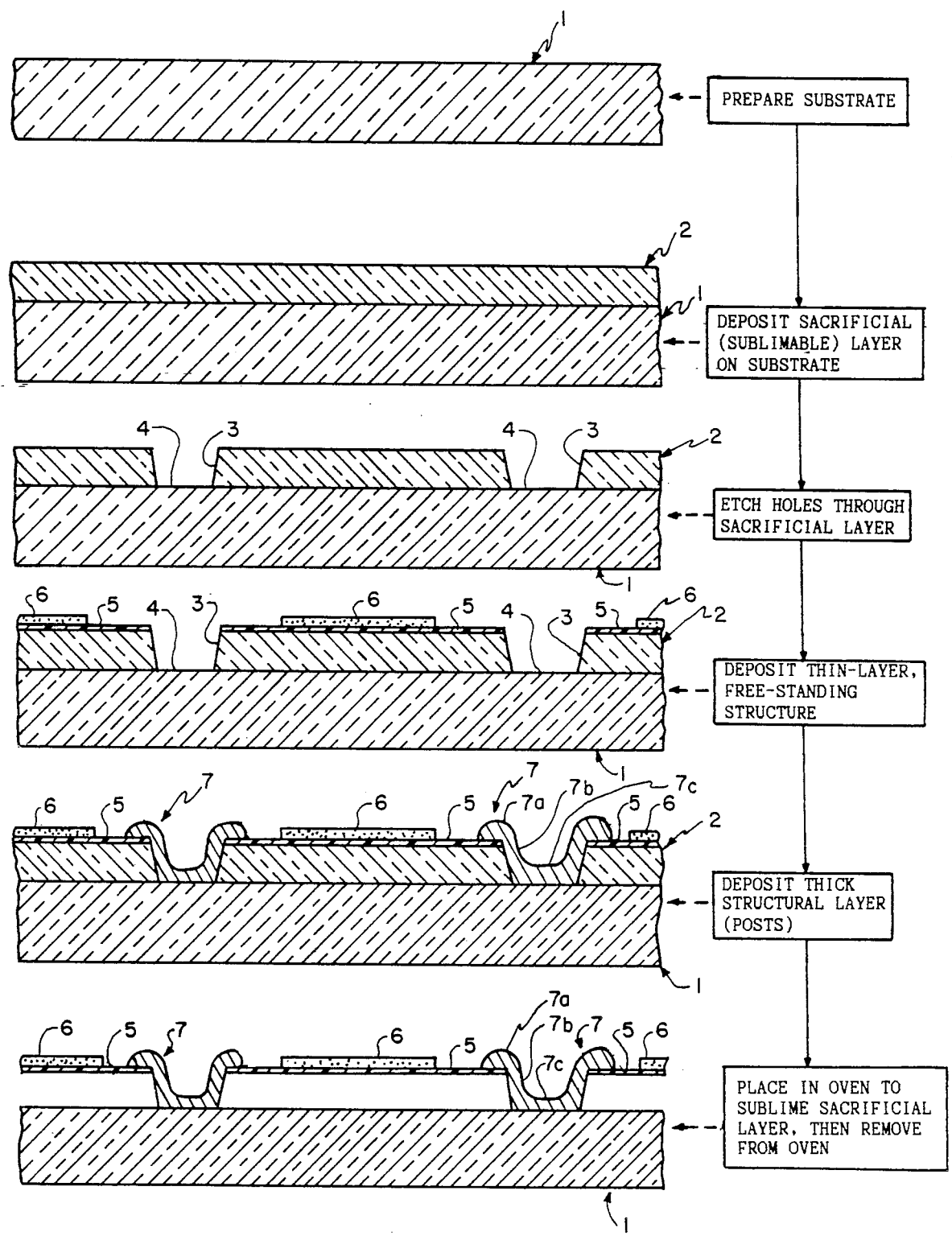

PROCESS FOR FABRICATING THREE-DIMENSIONAL, FREE-STANDING MICROSTRUCTURES

The invention described herein may be manufactured, used, and licensed by the U.S. Government for governmental purposes without the payment of any royalties thereon.

BACKGROUND OF INVENTION

This invention is in the field of microstructures, i.e., structures which have one or more dimensions measured in microns. Nowadays it is not uncommon for electronic integrated circuits to have elements with such measures. These circuits, unless they are multiple-layered, are essentially planer and thin layered, with the elements partially or wholly infused into a substrate, or tightly bound to the substrate, with no space between elements and substrate. For multiple-layered circuits, successive layers are tightly bound to previous layers, with no space therebetween. Various techniques are used to produce such circuits, such as masking, etching, ion implanting in various ways, laser, ion, electron beam, and plasma milling, etc. Wet chemical etching and milling with charged particles or plasmas are highly satisfactory techniques when one is working with such tightly bound layers. If, however, one is fabricating a microstructure with spaces between thin layers or between thin layers and a substrate, surface tension from wet etching and charge buildup from plasma or charged particles can destroy such layers. Examples of microstructures is which such spaces may be desirable are: multiple-layer integrated circuits in which gas or vacuum dielectric is needed between portions of layers (obviously, something much be left to physically support successive layers), arrays of thermal detectors, integrated optical circuits, acoustic transducer arrays, and flat panel displays.

The present invention can produce microstructures will space between closely-spaced layers or between such layers and a substrate.

SUMMARY OF THE INVENTION

The invention is a process for fabricating three-dimensional, free-standing microstructures. Such microstructures have one or more structural dimensions measured in microns, and may have thin layers measured in angstrom units. Beginning with a thick substrate, we deposit a sacrificial layer with a thickness which determines the vertical structural dimension of the microstructure. We then etch holes through the sacrificial layer and deposit the desired microstructure atop the remaining sacrificial layer. A relatively thick layer of structural material is then deposited atop portions of the microstructure and on the walls and bottoms of the holes through the sacrificial layer. Finally, the sacrificial layer is sublimed away, to leave a microstructure suspended from structural posts on the substrate.

BRIEF DESCRIPTION OF THE DRAWINGS

The single drawing FIGURE shows a flow chart of the inventive method alongside a series of greatly enlarged partial sectional views of the structure resulting from the flow chart steps.

DESCRIPTION OF PREFERRED EMBODIMENT

The invention may be best understood when this description is taken in conjunction with the drawing. Referring now to the drawing, we begin our process by preparing substrate 1 for the microstructure. The substrate is in the form of a thick slab and may be made of glass, silicon, or other material as desired. The requirements for the substrate are that it be dimensionally stable, and able to withstand the various environments or steps of the process. The preparation of the substrate may involve nothing more than cleaning and drying its surface. On the surface of the substrate we deposit relatively thick sacrificial sublimable layer 2. This layer is preferably applied by thermal vacuum evaporation. It should be pointed out that the drawing is not to scale, but that the layer thicknesses are exagerated for illustration purposes. Layer 2, for example, has a thickness in the 0.5 to 5 $\mu$m range; a typical material for this layer is $As_3S_3$. For some substrates, it may be desirable to deposit a thin layer (such as ZnS or Cr) on the substrate before layer 2 is applied, to enhance adhesion of layer 2. In the next step, we etch holes with sloped sides 3 and bottoms 4 through layer 2; this may be done by wet chemical etching, by plasma etching, or ion milling. Preferably, the sides slope at an angle of approximately 18° to a perpendicular of the substrate surface. What will eventually be free-standing structures are next deposited (by vacuum evaporation, sputtering, or a similar process). These are shown on the drawing as thin layers 5 and 6; these layers are only a few hundred angstroms thick. Obviously, it may be necessary to mask layer 2 when applying layer 5 and mask layer 5 when applying layer 6. These are obvious steps and the particular ways in which they are done are not critical to the invention. A thick structural layer 7 of a material such as ZnS, SiO, etc. is next deposited to form suspension posts. Each post includes top portion 7a, sloping side 7b, and bottom portion 7c. Because of the slope of sides 7b, their thickness is less than that of tops 7a and bottoms 7c. The preferred thicknesses of 7a and 7c are in the range from 3000–9000Å, and 7b will be about one-third of this. In our last major step, the sacrificial layer is sublimed away in an oven. For an $As_2S_3$ sacrificial layer, the oven temperature is 130–180° C., and the substrate with its various layers is illuminated with UV radiation and is exposed to a flow of $O_2$ to enhance the sublimation. When layer 2 is totally sublimed, the finished structure is removed from the oven. Thin layers 5 and 6 are supported by post of structural layer 7 and were not exposed to wet processes which might have caused their destruction from surface tension forces.

Although we have mentioned only $As_2S_3$ as our sacrificial layer, other materials may be used as long as they satisfy the following requirements: they must be insoluble in water (in order to withstand washing which may be used when applying the thin layers), they must not melt or sublime below 100° C. (since baking may be used in some processes of applying the thin layers), and they must be depositable by vacuum evaporation, spattering, etc. in uniform and homogenous layers at least 1–2 $\mu$m thick.

We claim:
1. A method of fabricating a three-dimensional, free-standing microstructure including the steps of:
   preparing a substrate for said microstructure;
   depositing a sacrificial layer on said substrate;

removing at least a portion of said layer in a desired pattern to form holes through said sacrificial layer which expose portions of said substrate, said holes having bottoms and having sloping sides defined by the remaining sacrificial layer;

depositing at least one relatively thin layer in a pattern atop said sacrificial layer;

depositing a relatively thick structural material in a pattern to continuously cover the sides and bottoms of said holes through said sacrificial layer and to cover at least a portion of said relatively thin layer;

and exposing the structure from the preceeding steps to heat and electromagnetic radiation in an oxidizing atmosphere to cause sublimeton of the remaining sacrificial layer, whereby a structure is produced which has said relatively thin layer supported above said substrate by posts of said structural material.

* * * * *